(12) United States Patent
Song et al.

(10) Patent No.: US 7,924,647 B2
(45) Date of Patent: Apr. 12, 2011

(54) FUSE CIRCUIT AND DRIVING METHOD THEREOF

(75) Inventors: Keun-Soo Song, Gyeonggi-do (KR); Kwan-Weon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 94 days.

(21) Appl. No.: 12/494,616

(22) Filed: Jun. 30, 2009

(65) Prior Publication Data
US 2010/0290302 A1 Nov. 18, 2010

(30) Foreign Application Priority Data

May 13, 2009 (KR) .................. 10-2009-0041599

(51) Int. Cl.
*G11C 17/18* (2006.01)
(52) U.S. Cl. ..................... 365/225.7; 365/201
(58) Field of Classification Search .................. 365/96; 327/525, 526
See application file for complete search history.

(56) References Cited

U.S. PATENT DOCUMENTS

| 4,969,124 A | * | 11/1990 | Luich et al. | 365/201 |
| 5,140,554 A | * | 8/1992 | Schreck et al. | 365/201 |
| 5,381,371 A | * | 1/1995 | Haraguchi | 365/200 |
| 5,557,573 A | * | 9/1996 | McClure | 365/201 |

FOREIGN PATENT DOCUMENTS

| KR | 1020060039319 | 5/2006 |
| KR | 100783635 | 12/2007 |
| KR | 100818100 | 4/2008 |

OTHER PUBLICATIONS

Notice of Preliminary Rejection issued from Korean Intellectual Property Office on Nov. 15, 2010.

* cited by examiner

*Primary Examiner* — Tan T. Nguyen
(74) *Attorney, Agent, or Firm* — IP & T Group LLP

(57) ABSTRACT

A fuse circuit includes a fuse unit configured to form a current path on a first node according to whether or not a fuse is cut; a driving current controller configured to control a potential level of the first node in response to a test signal; and an output unit configured to output a fuse state signal in response to the potential level of the first node.

20 Claims, 8 Drawing Sheets

FUSE CIRCUIT AND DRIVING METHOD THEREOF

CROSS-REFERENCE TO RELATED APPLICATIONS

The present application claims priority of Korean Patent Application No. 10-2009-0041599, filed on May 13, 2009, the disclosure of which is incorporated herein by reference in its entirety.

BACKGROUND OF THE INVENTION

The present invention relates to a technology for designing a semiconductor, and more particularly, to a fuse circuit for performing various circuit operations by using a fuse, and a driving method thereof.

In general, as degree of integration for semiconductor devices including a Double Data Rate Synchronous DRAM (DDR SDRAM) has been rapidly increased, more than tens of millions of memory cells are being provided within one semiconductor device. However, if a failure occurs in any one of these memory cells, a corresponding semiconductor device may fail to perform a desired operation. With technical development of a process of the semiconductor device, a failure occurs in a small amount of memory cells of the semiconductor device. Even if the semiconductor device has few defective memory cells, the semiconductor device may be discarded resulting in poor product yield efficiency. In order to counter this, use of redundancy memory cells also extra normal memory cells have been proposed. If a failure occurs in the normal memory cells, the redundancy memory is replaced and used. Hereafter, a memory cell required to be replaced with a redundancy cell due to presence of defective cells is referred to as "a memory cell to be repaired."

Address information corresponding to the memory cell to be repaired is programmed in a fuse circuit for redundancy. The fuse circuit for redundancy includes a plurality of fuses for programming of address information. In other words, the fuse circuit for redundancy outputs the programmed address information, and the semiconductor device compares the output signal with address information applied during read and write operations, so that if the memory cell to be repaired is accessed, the redundancy memory cell is allowed to be accessed instead of the memory cell to be repaired.

For reference, a scheme for programming a fuse includes an electrical fuse-cutting method, a laser cutting scheme, or so on. Herein, the electrical fuse-cutting method is based on the fact that over-currents are applied to the fuse to be cut so as to melt, resulting in disconnection of the fuse to be cut. The laser cutting scheme is based on the fact that laser beams are used for blowing of the fuse to be cut, resulting in disconnection of the fuse to be cut. In general, the laser cutting scheme is widely used as compared with the electrical fuse-cutting method, because it is simper than the electrical fuse-cutting method.

Meanwhile, fuses are used in performing various operations throughout semiconductor devices, as well as a fuse circuit for redundancy described above. For example, the fuses are used in tuning a voltage in a constant voltage generation circuit operated sensitively to a process. Also, the fuses are variously used in a control circuit for a test, a control circuit for selection of various modes, or so on. Hereafter, for illustration purpose, a description will be given of an example of a fuse circuit for redundancy that uses fuses.

FIG. 1 is a circuit diagram illustrating a fuse circuit for redundancy, which constitutes a conventional semiconductor device.

Referring to FIG. 1, the fuse circuit for redundancy includes a fuse unit 110, a latching unit 130, a pre-charging unit 150, and a buffering unit 170.

The fuse unit 110 is configured to drive a common node COM of an output stage by a driving current flowing through a current path having a fuse, in response to zero to third fuse enable signals EN_ADD<0:3>. The fuse unit 110 includes a plurality of fuses 112, and a plurality of switching units 114.

The fuses 112 are used to program address information corresponding to a memory cell to be repaired, and include zero to third fuses F0, F1, F2, and F3. The switching units 114 are used to receive the fuse enable signals EN_ADD<0:3>, respectively, so as to form a pull-down current path having a corresponding fuse. The switching units 114 include zero to third NMOS transistors NM0, NM1, NM2, and NM3.

The latching unit 130 is configured to latch a corresponding logic value according to a voltage level of the common node COM operated in response to zero to third fuse enable signals EN_ADD<0:3>. The latching unit 130 includes zero and first inverters INV0, and INV1.

The pre-charging unit 150 is configured to set an initial logic value in the latching unit 130. The pre-charging unit 150 includes a zero PMOS transistor PM0, which has a source-drain path between a power source voltage VDD stage and a common node COM and receives a pre-charging signal PCGB through a gate thereof. Herein, the pre-charging signal PCGB transits from a logic 'low' to a logic 'high' when a semiconductor device performs an active operation, a read operation, or a write operation.

The buffering unit 170 is configured to receive an output signal of the latching unit 130, and to output a fuse state signal INF_ADD, and includes two inverters. Herein, the fuse state signal INF_ADD includes address information of a memory cell to be repaired programmed in a plurality of the fuses 112. The semiconductor device determines whether a memory cell to be accessed corresponds to a memory cell to be repaired, in response to the fuse state signal INF_ADD.

Hereafter, for illustration purpose, it will be described how the fuse circuit for redundancy is operated according to whether or not a zero fuse enable signal EN_ADD<0> is activated for each of cases where the zero fuse F0 is cut, and not cut.

First, since the common node COM is pre-charged in response to the pre-charging signal PCGB of a logic 'low', the latching unit 130 lathes a logic 'high'. Thereafter, at the time of an active operation, a read operation, or a write operation, the pre-charging signal PCGB transits from a logic 'low' to a logic 'high', and the zero enable signal EN_ADD<0> is activated to be a logic 'high', and thus the zero NMOS transistor NM0 is turned on.

In this case, when the zero fuse F0 is not cut, since a pull-down current path is formed between the common node COM and a ground power source voltage (VSS) stage, a voltage level of the common node COM is lower than a threshold voltage of the zero inverter INV0, and a fuse state signal is a logic 'high'. Alternatively, when the zero fuse F0 is cut, the common node COM maintains a logic 'high' by the latching unit 130. That is, since the pull-up current path by the first driving unit INV1 is made, the common node COM maintains a logic 'high', and the fuse state signal INF_ADD is a logic 'low'.

As described above, the fuse state signal INF_ADD maintains a logic 'low' or a logic 'high' according to whether or not a corresponding fuse is cut. The semiconductor device receives address information of the memory cell to be repaired based on the fuse state signal INF_ADD.

Meanwhile, as the process technology of the semiconductor device is being advanced, the semiconductor device is being downsized by reduction in spacing not only between components constituting a circuit, but also between fuses. Reduction in spacing between fuses may cause the following problems, when a blowing process is performed for cutting of the fuses.

That is, the fuse adjacent to the fuse to be cut suffers damage (e.g. crack) which is caused by a conductive by-product, and impact generated at the time of performing a blowing process. Of course, the crack may not occur at the time of performing a blowing process, but may occur also due to stress between fuses and insulating layer covering the fuses, or an erroneous process. In case where the crack occurs in the fuse, the most serious problem is that a fuse intended to not be cut may be placed in a situation where the fuse is determined as 'cut fuse'. This situation may cause a malfunction of the semiconductor device.

In general, the crack occurring in the fuse is classified into three types. The first type is a failure crack that causes failure of the fuse by the crack itself. The second type is a progressive crack that causes failure of a fuse according to an environment and time. The third type is a free crack that does not cause a failure in life time of a semiconductor device because a degree of a crack occurring in the fuse is insignificant. In a case of the first type, since the semiconductor malfunctions before its shipment, its malfunction is detected in a test mode, such as probe test, or a package test, and accordingly, it is possible to prevent its malfunction, or to determine the semiconductor device as a "defective". However, in a case of the second type, since a malfunction of the semiconductor device is not detected in a test mode performed before its shipment, normal judgment is not made. In addition, because the semiconductor device malfunctions after being shipped, consumers using the semiconductor device may encounter malfunctions.

FIG. 2 is a waveform diagram illustrating a voltage level change of a common node COM according to a fuse stat of FIG. 1.

Referring to FIGS. 1 and 2, when the fuse is cut, the common node COM is driven by a driving current flowing through a pull-up current path made by a first inverter INV1, and maintains a high voltage level. That is, the voltage level of the common node COM is determined by the driving current flowing through the pull-up current path. Alternatively, when the fuse is not cut, the common node COM is driven by the driving current flowing through the pull-down current path which is made by a corresponding fuse and the NMOS transistor coupled to the fuse, and maintains a low voltage level. In this case, a voltage level of the common node COM is determined by a driving current flowing through the pull-up current path and by a driving current flowing through pull-down current path.

FIG. 2 illustrates an example where a voltage level of the common node COM becomes high or low based on a resistance value of a fuse (for example, 60 KΩ). That is, when the resistance value of the fuse is lower than, for example, 60 KΩ, the common node COM has a low voltage level since pre-charged charges are discharged. When the resistance value of the fuse is higher than 60 KΩ, the common node COM maintains a high voltage level by a driving current flowing through the pull-up current path. Then, the voltage level of the common node COM determines a logic level of the fuse state signal INF_ADD. In other words, the logic level of the fuse state signal INF_ADD is determined according to whether or not a fuse is cut.

Meanwhile, a crack may occur in any fuses, as described above. At this time, a resistance value of the fuse not being cut becomes increasingly high according to an environment and time. In other words, a normal fuse in a state of not being cut should have a resistance value lower than, for example, 60 KΩ. If a crack occurs in a fuse, the fuse may have a resistance value higher than that of a fuse where no crack occurs, but the fuse where a crack occurs may have a resistance value lower than 60 KΩ. Therefore, a detection result shows that the fuse where a crack occurs is not cut in a test mode, and thus is determined as a "normal fuse." However, a resistance value of a fuse where a crack occurs may become higher than 60 KΩ according to an environment and time. At this time, the semiconductor device malfunctions since a fuse not intended to be cut is recognized as a fuse that is cut.

Therefore, the fuse state signal INF_ADD to be a logic 'high' for a fuse not intended to be cut is a logic 'low' due to the crack, and reliability of the semiconductor device is reduced due to this malfunction.

SUMMARY OF THE INVENTION

An embodiment of the present invention is directed to providing a semiconductor device for controlling a driving current flowing through a current path having a fuse, thereby detecting fuses where a crack occurs.

Another embodiment of the present invention is directed to providing a semiconductor device for determining an appropriate force to be applied to fuses when the fuses are cut, through a test result which may be obtained by adjusting a driving current flowing through a current path having fuses.

In accordance with an aspect of the present invention, there is provided a fuse circuit including a fuse unit configured to form a current path at a first node according to whether or not a fuse is cut; a driving current controller configured to control a potential level of the first node in response to a test signal; and an output unit configured to output a fuse state signal in response to the potential level of the first node.

The driving current controller may drive the first node after receiving a feedback of the fuse state signal.

The fuse circuit may further include a pre-charging unit configured to pre-charge the first node in response to a pre-charging signal.

The driving current controller may allow a potential of the first node in the test mode to be greater than that in a normal mode.

The driving current controller may include a first driving unit configured to receive the test signal, and to drive the first node in response to the test signal; and a second driving unit configured to receive the test signal, and to drive the first node in response to the test signal, wherein the first driving unit and the second driving unit each have a different driving strength from the other.

The first driving unit may be enabled during the normal mode, the second driving unit may be enabled during the test mode, and the second driving unit may have a current driving strength greater than that of the first driving unit.

The driving current controller may include a basic driving unit configured to receive the fuse state signal, and drive the first node; and an additional driving unit configured to receive the fuse state signal, and to additionally drive the first node in response to the test signal.

The basic driving unit may be enabled during the normal mode, and the basic driving unit and the additional driving unit may be enabled during the test mode.

The fuse unit may include a fuse configured to program desired information; and a switching unit configured to couple the fuse into the current path in response to the fuse enable signal, wherein the fuse and the switching unit may be coupled between the first node and a power source voltage stage.

The fuse unit may include a plurality of fuses configured to be used to program address information corresponding to a memory cell to be repaired; and a plurality of switching units configured to correspond to each of the plurality of fuses, and to couple a corresponding fuse among the plurality of the fuses into the current path in response to an address signal corresponding to the fuse enable signal.

In accordance with another aspect of the present invention, there is provided a fuse circuit including a fuse unit configured to form a current path on a first node whether or not a fuse is cut; a latching unit configured to latch the first node so as to output a fuse state signal; and a supply current controller configured to control a driving current applied to the latching unit in response to a test signal.

The fuse circuit may further include a pre-charging unit configured to pre-charge the first node in response to the pre-charge signal, and to set an initial value in the latching unit.

The supply current controller may include a bias voltage generation unit configured to generate a bias voltage corresponding to the test signal; and a current supply unit configured to supply the latching unit with the driving current corresponding to the bias voltage.

The supply current controller may allow the driving current in a test mode to be greater than that in a normal mode and applies the resultant driving current to the latching unit.

The fuse unit may include a fuse configured to be used to program desired information; and a switching unit configured to couple the fuse into the current path in response to the fuse enable signal, wherein the fuse and the switching unit may be coupled between the first node and the power source voltage stage.

The fuse unit may include a plurality of fuses configured to be used to program address information corresponding to the memory cell to be repaired; and a plurality of switching units configured to correspond to each of the plurality of the fuses, and to couple a corresponding fuse among the plurality of fuses into the current path in response to an address signal corresponding to the fuse enable signal.

The latching unit may include a forward driving unit configured to output the fuse state signal in response to the potential level of the first node; and a backward driving unit configured to be supplied with the driving current controlled from the supply current controller, and to drive the first node after receiving a feedback of the fuse state signal.

In accordance with another aspect of the present invention, there is provided a method for driving a fuse circuit including: generating a test signal when a test mode is entered; forming a current path through a first node and a fuse; driving the first node in response to a test signal; and detecting a state of the fuse after buffering a potential of the first node.

The first node may include driving the first node in a normal mode by a normal driving current flowing through the current path; and driving the first node in a test mode by a test driving current greater than the normal driving current.

The fuse may have address information, corresponding to a memory cell to be repaired, programmed therein.

The present invention may detect a fuse where a crack occurs by adjusting a driving current flowing through a current path having fuses. It is also possible to perform corrective steps for a fuse where a crack occurs, based on the detected result. In addition, it is possible to secure reliability of a circuit having fuses through these corrective steps. It is possible to guarantee a stable repair operation for the fuse circuit for redundancy.

Further, it is possible to acquire data capable of judging an appropriate force applied to a fuse when the fuse is cut, through the test operation as in the present invention, resulting in more rapid and stable cutting of a fuse.

DESCRIPTION OF SPECIFIC EMBODIMENTS

Other objects and advantages of the present invention may be understood by the following description, and become apparent with reference to the embodiments of the present invention.

Figure 3:
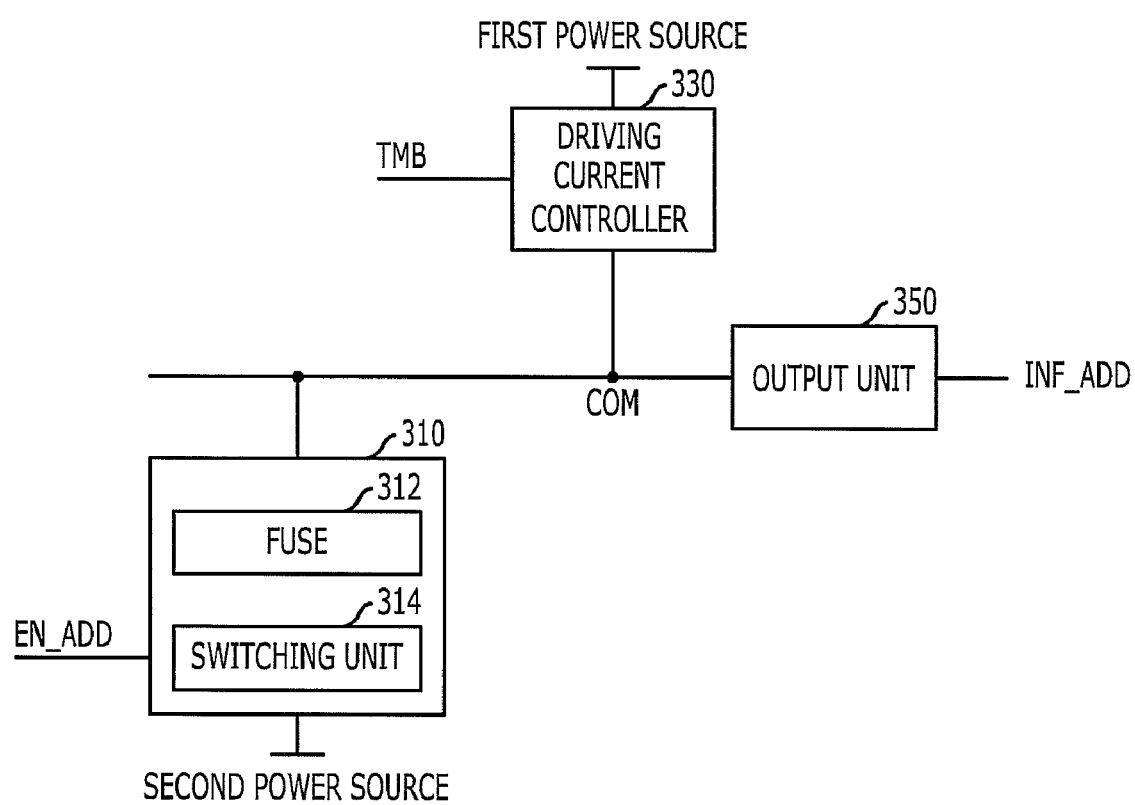
FIG. 3 is a block diagram illustrating a semiconductor device in accordance with the embodiment of the present invention.

FIG. 3 is a block diagram illustrating a semiconductor device in accordance with the present invention.

Referring to FIG. 3, the semiconductor device includes a fuse unit 310, a driving current controller 330, and an output unit 350.

The fuse unit 310 is configured to form a current path including a fuse 312, according to whether or not the fuse 312 is cut, in response to a fuse enable signal EN_ADD. The fuse unit 310 includes the fuse 312 where desired information is programmed, and a switching unit 314 for including the fuse into the current path, in response to the fuse enable signal EN_ADD.

The driving current controller 330 controls a driving current flowing through the current path in response to a test signal TMB, thereby driving a common node COM of an output stage of the fuse unit 310. In the present invention, it is possible to control the driving current flowing to the current path through the test signal TMB. That is, the potential level of the common node COM is controlled through a current path of the driving current controller 330 and a current path of the fuse unit 310 and the fuse 312, wherein the driving current controller 330 is supplied with a first power source, and is operated in response to the test signal TMB, the fuse unit 310 is supplied with a second power source and the fuse 312 is not cut and the fuse unit is operated in response to the fuse state signal INF_ADD.

The output unit 350 outputs the fuse state signal INF_ADD in response to the potential level of the common node COM. Herein, the fuse state signal INF_ADD has a predetermined logic value according to whether or not the fuse 312 is cut.

Figure 4:
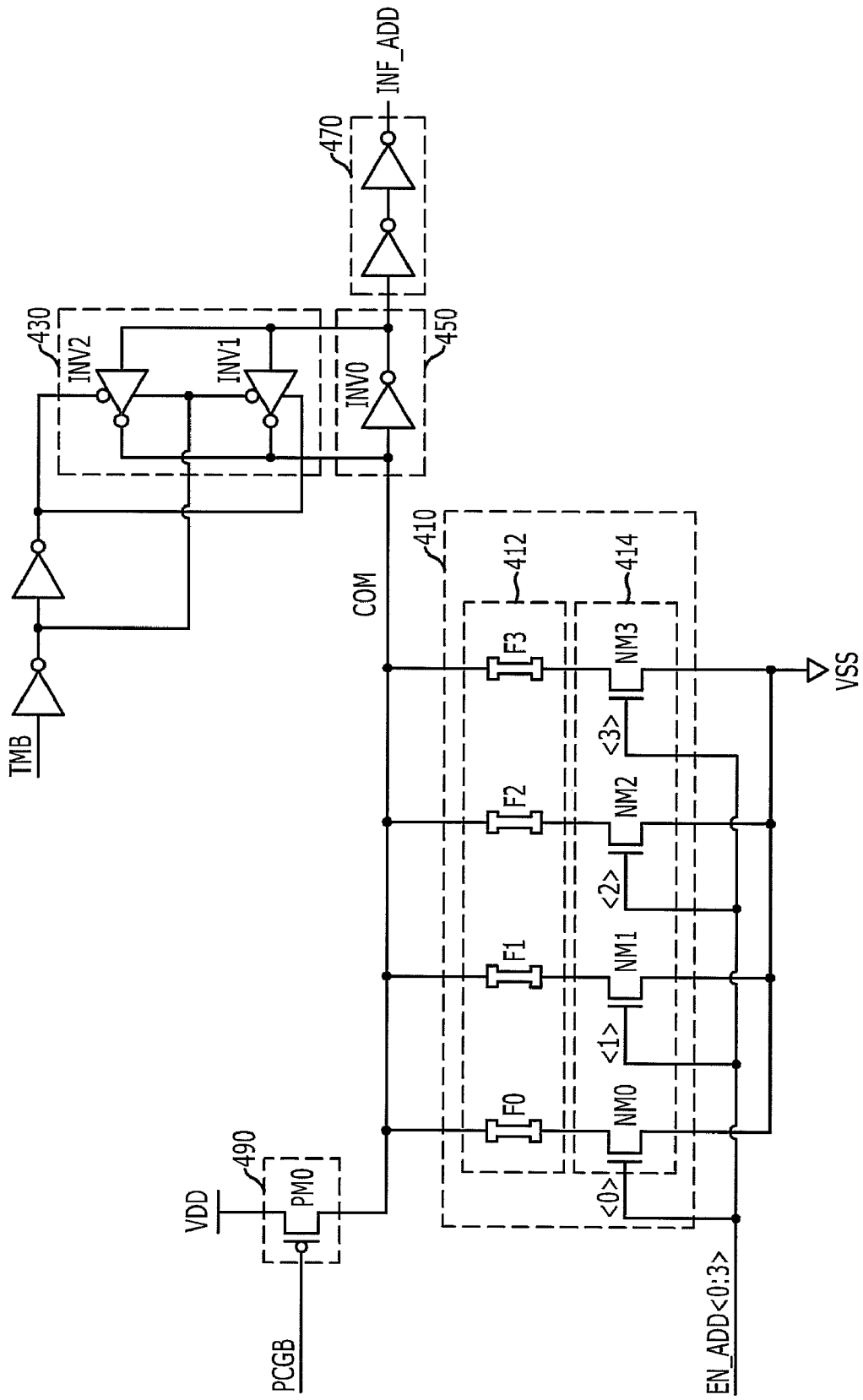
FIG. 4 is a circuit diagram illustrating a fuse circuit for redundancy constituting a semiconductor device in accordance with a first embodiment of the present invention.

FIG. 4 is a circuit diagram illustrating a fuse circuit for redundancy constituting the semiconductor device in accordance with a first embodiment of the present invention.

Referring to FIG. 4, the fuse circuit for redundancy includes a fuse unit 410, a driving current controller 430, an output unit 450, a buffering unit 470, and a pre-charging unit 490.

The fuse unit 410 is configured to form a current path according to whether or not a corresponding fuse is cut, in response to the fuse enable signals EN_ADD<0:3>, and includes a plurality of fuses 412, and a plurality of switching units 414.

The plurality of fuses 412 are used for programming of desired information, e.g. address information corresponding to a memory cell to be repaired, and includes zero to third fuses F0, F1, F2, and F3. Herein, the number of the fuses may vary depending on deign of the semiconductor device.

The plurality of switching units 414 are configured to form a pull-down current path including a corresponding fuse after receiving each of the fuse enable signals EN_ADD<0:3>, and include zero to third NMOS transistors NM0, NM1, NM2, and NM3 coupled to each of the zero to third fuses F0, F1, F2, and F3. Herein, in a case of the fuse circuit for redundancy, the fuse enable signals EN_ADD<0:3> are signals that are obtained by decoding addresses applied from an outside, and are activated according to a memory cell mat selected at the time of a read operation and a write operation of the semiconductor device. For reference, the memory cell matrix (mat) refers to a set of memory cells grouped from among a plurality of memory cells, and the zero to third fuse enable signals EN_ADD<0:3> are activated according to the memory cell mat which includes desired memory cells to be accessed.

The driving current controller 430 controls a driving current flowing through the pull-up current path in response to the test signal TMB, thereby driving the common node COM of an output stage of the fuse unit 410, and includes first and second driving units INV1, and INV2.

Herein, the first and second driving units INV1, and INV2 receive a feedback of a signal outputted from the output unit 450, and are controlled by each of the test signals TMB. The first and second driving units INV1 and INV2 in accordance with the present invention have mutually different current driving strength, and are enabled in response to the test signals TMB according to a normal mode and a test mode. In other words, at the time of the normal mode, the test signal TMB is a logic 'high', and the first driving unit INV1 having a driving strength lower than that of the second driving unit INV2 is enabled. Alternatively, at the time of the test mode, the test signal TMB is a logic 'low' and the second driving unit INV2 having a driving strength greater than that of the first driving unit INV1 is enabled. In the end, the driving current controller 430 may drive the common node COM in the test with at a current driving strength greater than that of the normal mode.

The output unit 450 is configured to output a signal corresponding to a potential level of the common node COM, and includes a zero driving unit INV0. The buffering unit 470 outputs the fuse state signal INF_ADD after buffering an output signal of the zero driving unit INV0. Herein, the fuse state signal INF_ADD has a predetermined logic value according to whether or not the plurality of fuses 412 are cut. Then, the fuse state signal INF_ADD includes address information of the memory cell to be repaired programmed in the fuses 412. The semiconductor device determines whether a memory cell to be accessed is a memory cell to be repaired, in response to the fuse stage signal INF_ADD.

The pre-charging unit 490 is configured to pre-charge the common node COM, and includes a zero PMOS transistor which has a source-drain path between the power source voltage VDD stage and the common node COM, and receives the pre-charging signal PCGB signal thereof. Herein, the pre-charging signal PCGB transits from a logic 'low' to a logic 'high' at the time of an active operation, a read operation, or a write operation of the semiconductor device. In a period at which the pre-charging signal PCGB is a logic 'low', the common node COM is pre-charged to a potential level corresponding to a power source voltage (VDD).

Hereafter, it will be described how the fuse circuit for redundancy is operated according to whether or not a zero fuse enable signal EN_ADD<0> is activated for each of cases where the zero fuse F0 is cut or not cut at the time of a normal mode.

In the present invention, since the test signal TMB is a logic 'high' at the time of the normal mode, the second driving unit INV2 is not operated. First, the common node COM is pre-charged in response to the pre-charging signal PCGB of a logic 'low'. Thereafter, at the time of performing an active operation, a read operation, or a write operation, the pre-charging signal PCGB transits from a logic 'low' to a logic 'high'. The zero fuse enable signal EN_ADD<0> is activated to be a logic 'high', and thus the zero NMOS transistor NM0 is turned on.

At this time, when the zero fuse F0 is not cut, since the pull-down current path is formed between the common node COM and a ground power source voltage (VSS) stage, a potential level of the common node COM is lower than a threshold value of the zero driving unit INV0, and the fuse state signal INF_ADD is a logic 'high'. Alternatively, when the zero fuse F0 is cut, the common node COM maintains a logic 'high' by the first driving unit INV1. That is, since the pull-up current path is formed by the first driving unit INV1, the common node COM maintains a logic 'high', and the fuse state signal INF_ADD is a logic 'low'. The semiconductor device receives address information of a memory cell to be repaired by using the fuse state signal INF_ADD of a logic 'high' or a logic 'low'.

Meanwhile, a description will be given of a case where a crack occurs in a state where the fuse is not cut. For illustration purpose, a description will be given of an example where a crack occurs in the zero fuse F0.

In the semiconductor device in accordance with the present invention, at the time of a test mode, the test signal TMB is a logic 'low', and accordingly, the first driving unit INV1 is not operated, but the second driving unit INV2 is operated. Herein, the second driving unit INV2 has a current driving strength greater than that of the first driving unit INV1, and thus the common node COM is driven in the test mode at a driving current greater than that of the normal mode. In other words, a resistance value of the zero fuse F0 where the crack occurs becomes higher than that of a fuse where no crack occurs. In the related art, in the test mode, it is impossible to detect the zero fuse F0 having a resistance value increased due to the crack. However, in the semiconductor device in accordance with the present invention, it is possible to detect a resistance value of the zero fuse F0 increased due to the crack, by driving the common node COM in a test mode at a driving current higher than that of the normal mode.

Figure 5:
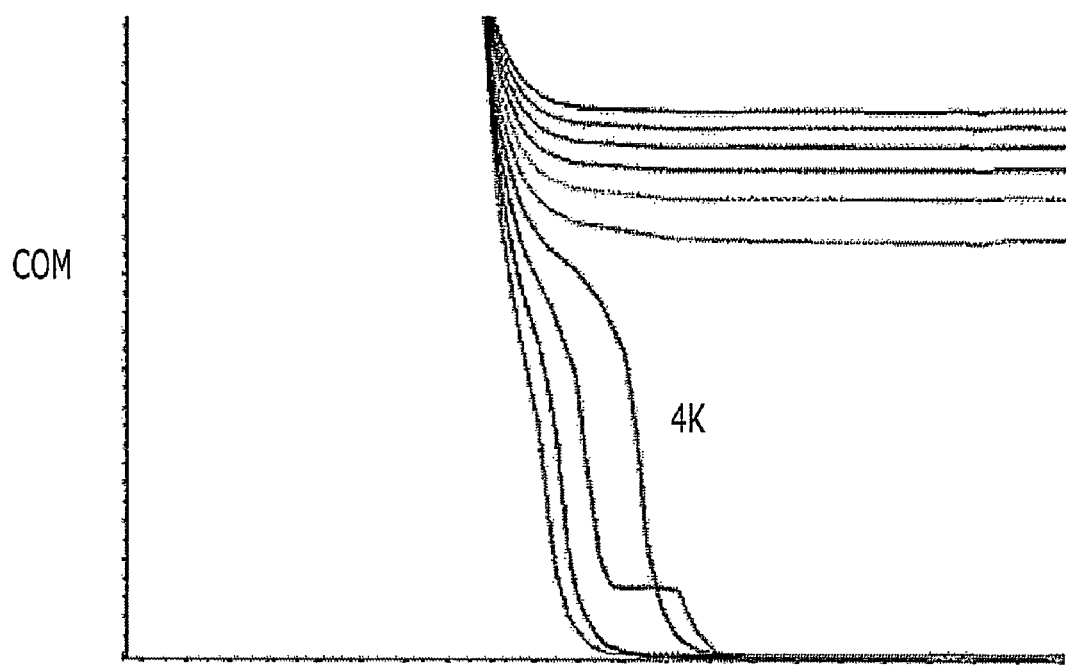
FIG. 5 is a waveform diagram illustrating a voltage level change of a common node COM according to a state of the fuse shown in FIG. 4.

FIG. 5 is a waveform diagram illustrating a potential level change of the common node COM according to a fuse state of FIG. 4.

Referring to FIGS. 4 and 5, when the fuse is cut, in the test mode, the common node COM is driven at a large driving current flowing through the pull-up current path made by the second driving unit INV2, and thus maintains a high potential level. That is, the potential level of the common node COM is determined by the driving current provided from the second driving unit INV2. When the fuse is not cut, in the test mode, the common node COM has a pull-down current path made by a corresponding fuse and an NMOS transistor coupled to the fuse. In this case, the potential level of the common node COM is determined by the driving current corresponding to the pull-down current path and the driving current provided from the second driving unit INV2. However, in the present invention, by increasing a driving current required for operation of the common node COM in the test mode, a fuse having a resistance value which is somewhat increased due to the crack may be detected as a "cut fuse."

Figure 1:
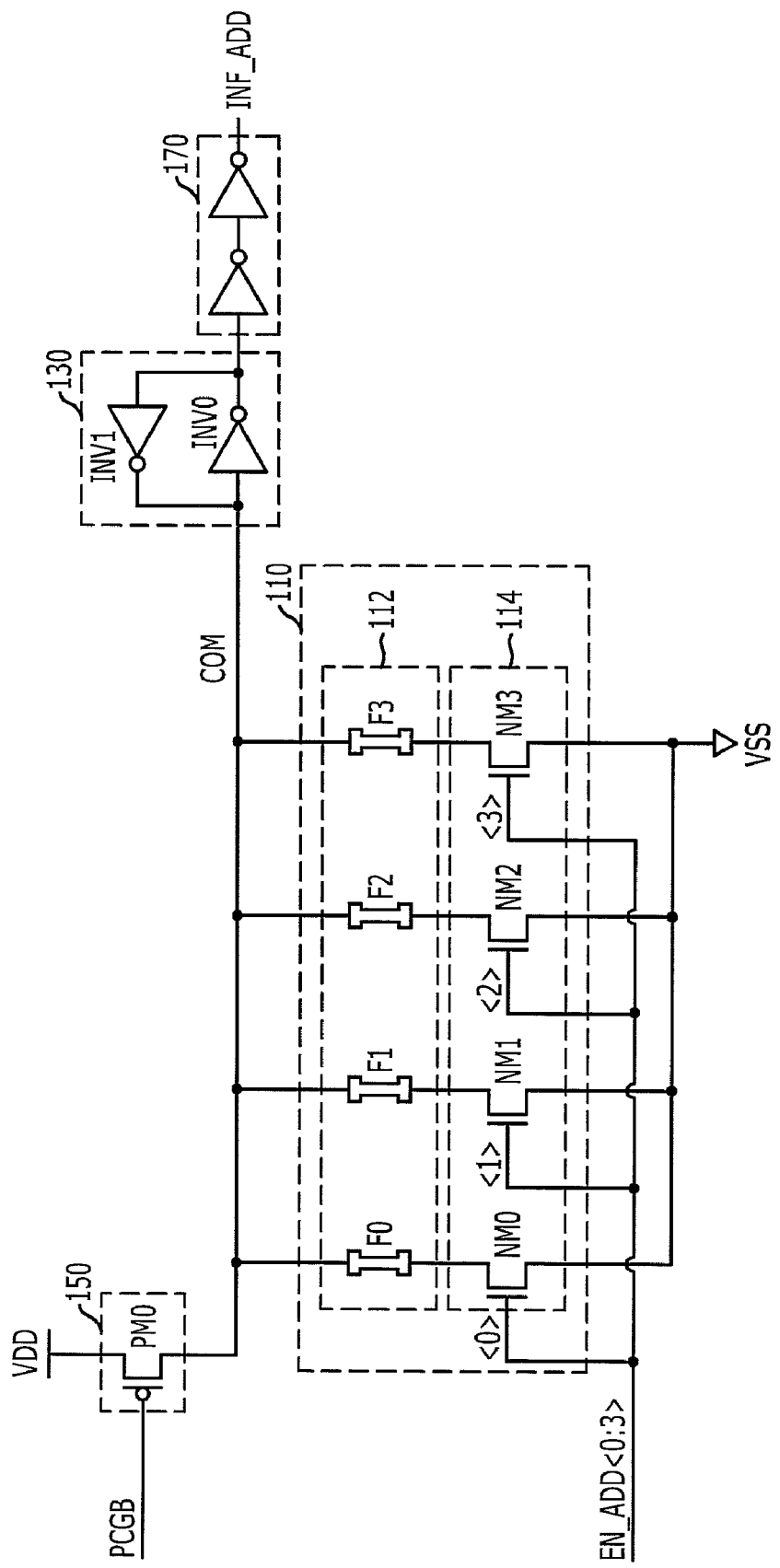
FIG. 1 is a circuit diagram illustrating a fuse circuit for redundancy constituting a conventional semiconductor device.
Figure 2:
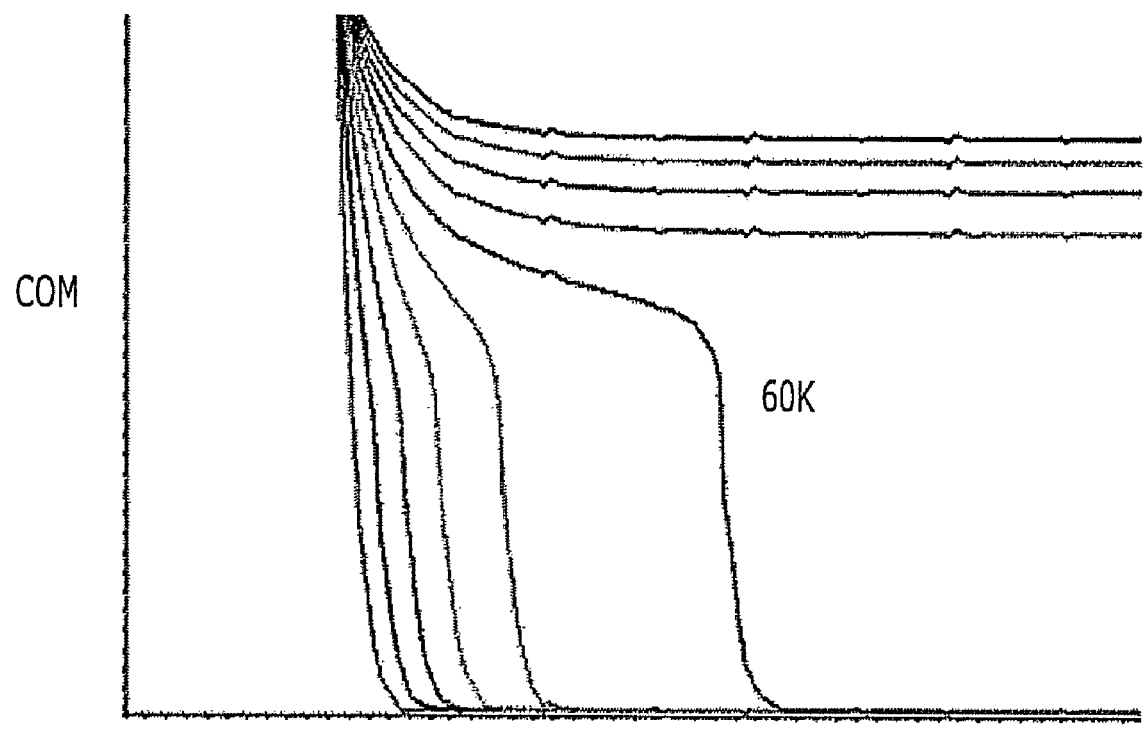
FIG. 2 is a waveform diagram illustrating a potential level change of a common node COM according to a state of the fuse shown in FIG. 1.

FIG. 5 illustrates an example where a potential level of the common node COM becomes high or low based on a resistance value of the fuse (for example, 4 KΩ) at the time of the test mode. That is, when the resistance value of the fuse is lower than 4 KΩ, charges pre-charged in the common node COM are discharged, and thus the common node COM has a low potential level. Alternatively, when the resistance value of the fuse is higher than 4 KΩ, the common node COM maintains a potential level high. FIG. 2 illustrates that the potential level of the common node COM is changed based on 60 KΩ in accordance with the related art, whereas FIG. 5 illustrates that the potential level of the common node COM is changed based on 4 KΩ in accordance with the present invention. That is, in the related art, when fuses that have not been cut have a resistance value of 60 KΩ or lower, corresponding fuses have been detected as 'normal fuses'. However, in the present invention, when the fuses have a resistance value of 4 KΩ or higher even if fuses that have not been cut have a resistance value of less than 60 KΩ, it is possible to detect the fuses that have not been cut as 'defective fuses'. In other words, when fuses that have not been cut have a resistance value larger than 4 KΩ by the crack, a detection result as in case where the fuses are cut may be obtained.

Then, the potential level of the common node COM is a direct factor that determines the fuse state signal INF_ADD. That is, when a resistance value of a fuse not being cut is higher than 4 KΩ due to the crack, the fuse state signal INF_ADD of a logic 'low' detected for the cut fuses is outputted. A test performer may determine whether or not a crack occurs in fuses by using the detection result, and perform corrective steps for fuses in which a crack occurs. Further, it is possible to generate a fuse state signal INF_ADD corresponding to a fuse state in a normal operation after the corrective steps treatment is performed. This means that the fuse circuit for redundancy prevents a malfunction of the semiconductor device occurring in the related art when it is normally operated, resulting in a stable repair operation.

Figure 6:
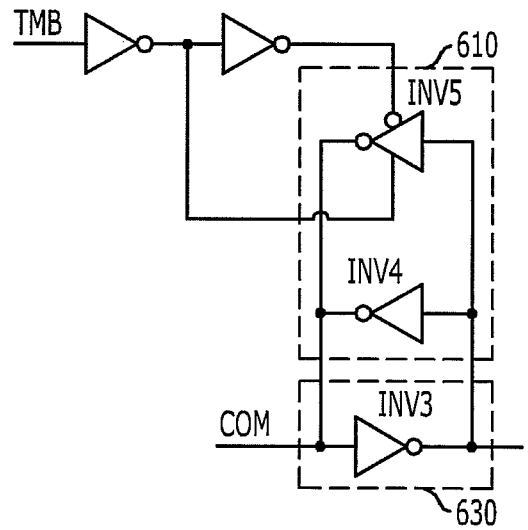
FIG. 6 is a circuit diagram illustrating a fuse circuit for redundancy constituting a semiconductor device in accordance with a second embodiment of the present invention.

FIG. 6 is a circuit diagram illustrating a fuse circuit for redundancy constituting the semiconductor device in accordance with a second embodiment of present invention. For illustration purpose, FIG. 6 illustrates only a driving current controller 610 different from that of FIG. 4.

Referring to FIG. 6, the driving current controller 610 is configured to drive the common node COM by controlling a driving current flowing through a pull-up current path in response to a test signal TMB. The driving current controller 610 includes a basic driving unit INV4, and an additional driving unit INV5. The output unit 630 is configured to output a signal corresponding to a potential level of the common node COM, and includes a third driving unit INV3.

Herein, the basic driving unit INV4 is configured to drive the common node COM after receiving a feedback of the output signal of the output unit 630, and is always enabled in a normal mode and a test mode. Then, the additional driving unit INV5 receives a feedback of the output signal of the output unit 630, and is configured to additionally drive the common node COM in response to the test signal TMB, and is enabled in the test mode.

Hereafter, an operation of the second embodiment will be briefly described.

In the normal mode, the basic driving unit INV4 operates the common node COM. That is, the common node COM is driven by a driving current flowing through the pull-up current path made by the basic driving unit INV4. In the test mode, the basic driving unit INV4 and the additional driving unit INV5 are operated. Further, the common node COM is driven by an additional driving current flowing through the additional pull-up current path made by the additional driving unit INV5, and by the driving current flowing through the pull-up current path made by the basic driving unit INV4. That is, the common node COM in the test mode is operated by adding an additional driving current to a driving current required for operation of the common node COM. Therefore, the second embodiment may obtain the same result as in the first embodiment.

Figure 7:
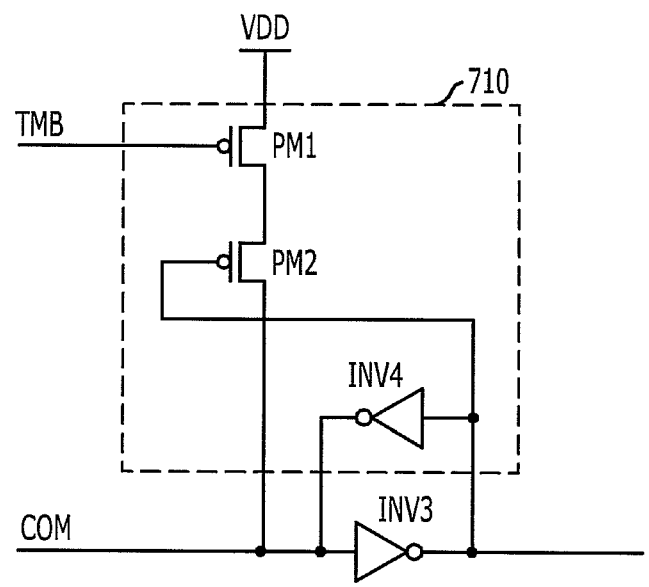
FIG. 7 is a circuit diagram illustrating a fuse circuit for redundancy constituting a semiconductor device in accordance with a third embodiment of the present invention.

FIG. 7 is a circuit diagram illustrating a resistance value constituting the semiconductor device in accordance with a third embodiment of the present invention.

FIG. 7 illustrates that the fuse circuit for redundancy is provided with first and second PMOS transistors PM1 and PM2, instead of the additional driving unit INV5 operated in response to the test signal TMB shown in FIG. 6. And, in the test mode, in a situation where the common node COM is driven by the driving current flowing through the pull-up current path after the first PMOS transistor PM1 is turned on, the second PMOS transistor PM2 is also turned on, and thus it is possible to add an additional driving current to the common node COM. In the third embodiment in accordance with the present invention, it is possible to minimize the area of a chip through a configuration having the number of transistors smaller than those in the first and second embodiments.

Figure 8:
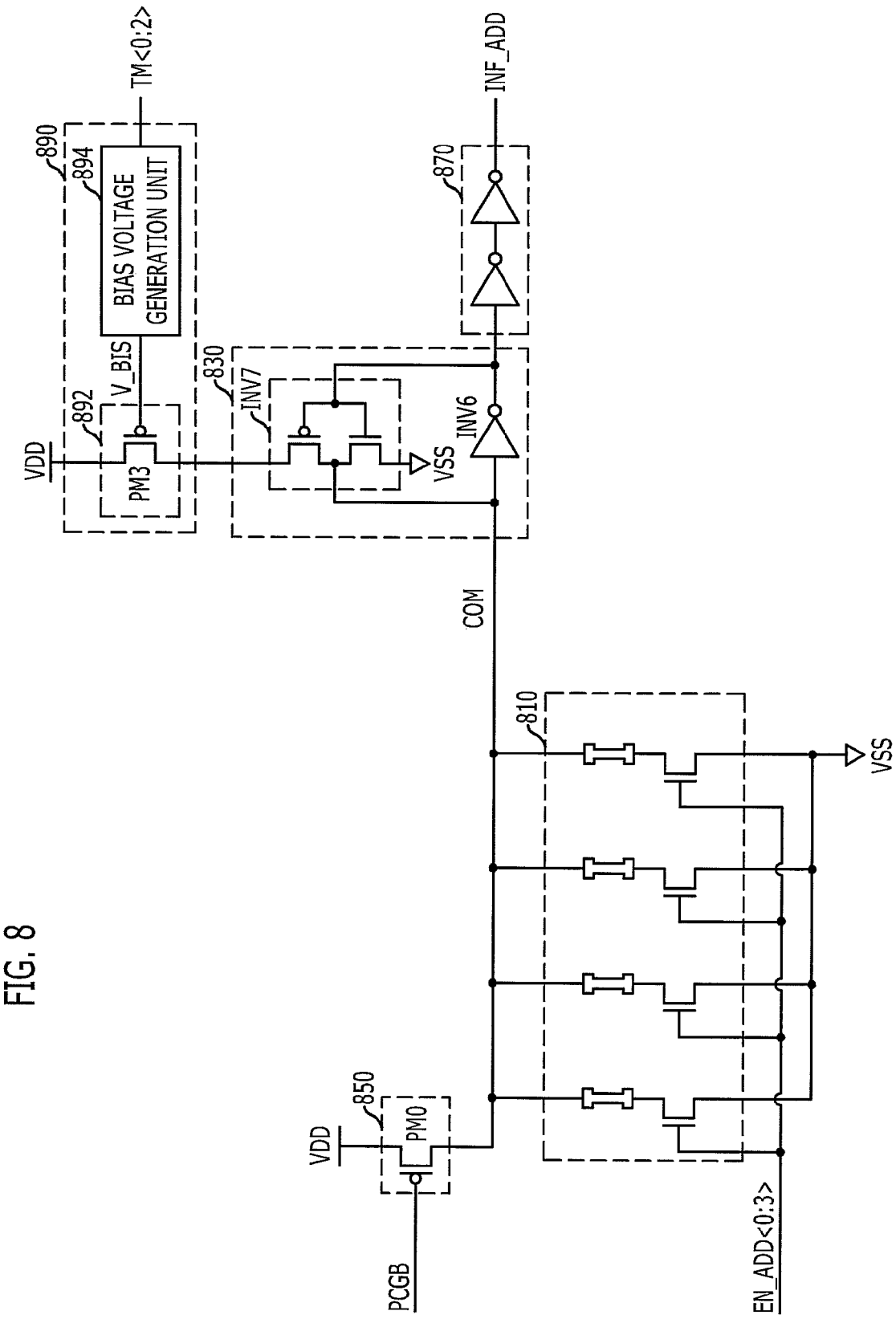
FIG. 8 is a circuit diagram illustrating a fuse circuit for redundancy constituting a semiconductor device in accordance with a fourth embodiment of the present invention.

FIG. 8 is a circuit diagram illustrating a fuse circuit for redundancy in accordance with a fourth embodiment of the present invention.

Referring to FIG. 8, the resistance value includes a fuse unit 810, a latching unit 830, a pre-charging unit 850, a buffering unit 870, a supply current controller 890.

The fuse unit 810 is configured to form a current path that includes a fuse according to whether or not the fuse is cut, in response to zero to third fuse enable signals EN_ADD<0:3>. The fuse unit 810 includes a plurality of fuses, and a plurality of switching units.

The latching unit 830 is configured to latch a logic value corresponding to a potential level of the common node COM which is operated in response to the zero to third fuse enable signals EN_ADD<0:3>, and includes sixth and seventh driving units INV6, and INV7. The pre-charging unit 850 sets an initial logic value in the latching unit 830, in response to the pre-charging signal PCGB, and the common node COM performs a pre-charging operation in response to the pre-charging signal PCGB. The buffering unit 870 detects a potential level of the common node COM, so as to output the pre-charging signal PCGB having information corresponding to the fuse state, and includes two inverters. The supply current controller 890 is configured to control a driving current applied to the latching unit 830 in response to the test signals TM<0:2>, and includes a bias voltage generation unit 894.

Herein, the current supply unit 892 is configured to supply the latching unit 830 corresponding to a bias voltage V_BIS with a driving current, and includes a third PMOS PM3 transistor which has a source-drain path formed between a power source voltage VDD stage and the latching unit 830, and receives the bias voltage V_BIS through a gate thereof.

The bias voltage generation unit 894 controls the current supply unit 892 by generating the bias voltage V_BIS having the potential level corresponding to the test signals TM<0:2>. The bias voltage generation unit 894 may be a circuit for generating a bias voltage V_BIS of a voltage level as desired according to design needs, through the test signals TM<0:2> or other methods. The bias voltage generation unit 894 generates the bias voltage V_BIS by using the test signals TM<0:2> composed of three codes. The test signals TM<0:2> may be used in both a normal mode and a test mode, and have a voltage level corresponding to the test signals TM<0:2>.

Hereafter, a description will be given of an operation of the fourth embodiment.

The semiconductor device in accordance with the present invention is characterized by the fact that a driving current required for operation of the common node COM is controlled in the test mode, so as to detect a fuse where a crack occurs.

In the fourth embodiment, to this end, a bias voltage V_BIS corresponding to the test signals TM<0:2> is generated, and then a gate of the third PMOS transistor PM3 is controlled through the generated bias voltage V_BIS. Then, the driving current flowing through the third PMOS transistor PM3 is applied to the seventh driving unit INV7 of the latching unit 830, and the common node COM is driven by a current path, which includes the third PMOS transistor PM3 and the PMOS transistor of the seventh driving unit INV7. In other words, in the fourth embodiment, it is possible to detect a fuse where a crack occurs, by allowing a driving current flowing in the test mode to be greater than a driving current flowing in the normal mode.

Figure 9:
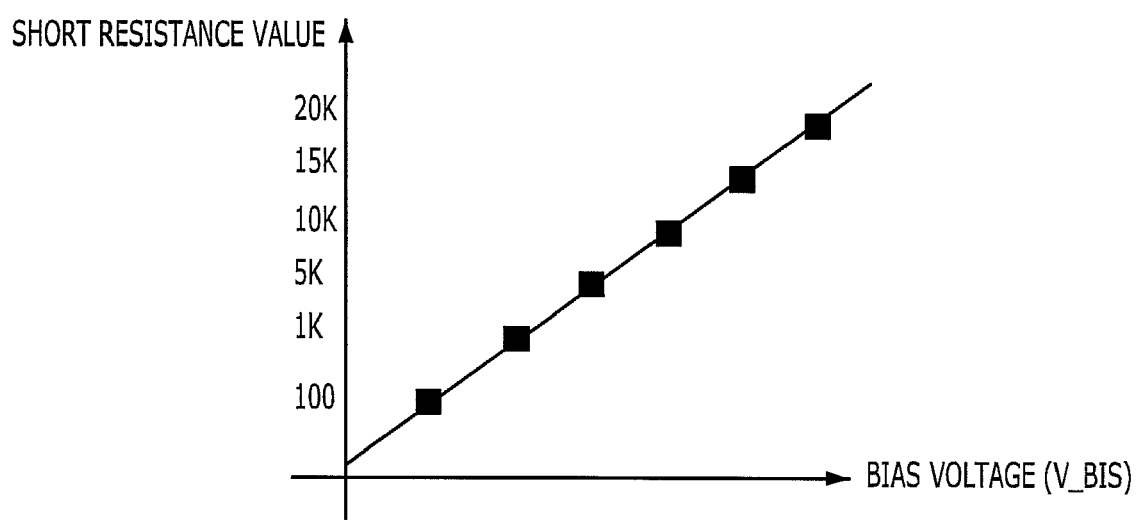
FIG. 9 is a graph illustrating a short-causing resistance value detected according to a bias voltage V_BIS shown in FIG. 8.

FIG. 9 is a graph illustrating a short-causing resistance value detected according to the bias voltage V_BIS of FIG. 8. Herein, the short-causing resistance value refers to a threshold resistance value used to detect information representing that a fuse is not cut. In other words, when it is assumed that the short-causing resistance value is, for example, 5 KΩ, for the fuse with a resistance value of 5 KΩ or lower, the fuse may be detected as a normal fuse which is not cut. For the fuse with a resistance value greater than 5 KΩ, the fuse may be detected as a fuse where a crack occurs. Herein, a short-causing resistance value is increased as a voltage level of the bias voltage V_BIS is increased, and a short-causing resistance value is decreased as a voltage level of the bias voltage V_BIS is decreased.

Therefore, in the normal mode, the bias voltage V_BIS corresponding to a short-causing resistance value of 15 KΩ is generated according to the test signal TM<0:2> so as to perform an operation. In the test mode, the bias voltage V_BIS is set to be lower than the short-causing resistance value of 15 KΩ, so that a fuse where a crack occurs may be detected. In this case, a level of the bias voltage V_BIS may be set depending on a degree of a crack which occurs in a fuse, i.e. a degree of a desired crack to be detected. That is, when a very small crack is intended to be detected, a voltage level of the bias voltage V_BIS is set to be low in conformity with a degree of a crack, so as to increase a driving current flowing on the current path, so that a crack occurring in a fuse may be detected. Also, in such a configuration, the bias voltage V_BIS is controlled through the test mode before a blowing process, so that a resistance value of the fuse may be confirmed.

Meanwhile, in a scheme for detecting a crack of the fuse in accordance with the present invention, it is possible to set strength (force) of laser beams to be in an optimal state at the time of a blowing process. That is, a fuse is cut by using a laser beam at a predetermined intensity, and then occurrence or non-occurrence of a crack of an adjacent fuse is detected, so that it is possible to determine whether an intensity of a current laser beam causes a crack to occur in the adjacent fuse. Therefore, a blowing process performer may optimize an intensity of a laser beam based on the detected result, and thus may perform rapid and stable blowing process.

As described above, the semiconductor device in accordance with the present invention may control a driving current flowing through a current path having fuses, so that a fuse where a crack occurs may be detected. Therefore, it is possible to perform corrective steps for the crack produced when the fuse is cut. It is also possible to increase reliability of a circuit having fuses through these corrective steps. In particular, for the fuse circuit for redundancy, it is possible to provide reliability in performing a repair operation.

The present invention may prevent a malfunction of the semiconductor device due to a crack, by detecting a fuse where the crack occurs.

Further, when this is used in the fuse circuit for redundancy, a fuse where a crack occurs is accurately detected and countered, so that it is possible to secure a stable repair operation of the semiconductor device.

Furthermore, it is possible to determine an appropriate force used in cutting a fuse, and the determined force is used so that more rapid and stable cutting of a fuse may be made.

While the present invention has been described with respect to the specific embodiments, it will be apparent to those skilled in the art that various changes and modifications may be made without departing from the spirit and scope of the invention as defined in the following claims.

Meanwhile, although the above-described embodiment has been illustrated taking one example where address information corresponding to a memory cell to be repaired is programmed in a fuse, the present invention may be applied to all circuits having fuses used to program desired information. In this case, the pre-charging signal PCGB, and fuse enable signals EN_ADD<0:3> shown in the embodiment may depend on a corresponding circuit.

Further, although the above-described embodiment has been illustrated taking one example where a driving current flowing through a pull-up current path is added or controlled, the present invention may be applied to a case where a driving current flowing through the pull-down current path, as well as the pull-up current path is added or controlled.

In addition, a logic gate and a transistor illustrated in the above embodiment will be implemented in a different position and a different type depending on a polarity of an input signal.

What is claimed is:
1. A fuse circuit, comprising:
   a fuse unit configured to form a current path on a first node according to whether or not a fuse is cut;
   a driving current controller configured to control a potential level of the first node in response to a test signal; and
   an output unit configured to output a fuse state signal in response to the potential level of the first node.

2. The fuse circuit of claim 1, wherein the driving current controller drives the first node in response to the fuse state signal.

3. The fuse circuit of claim 1, further comprising a pre-charging unit configured to pre-charge the first node in response to a pre-charging signal.

4. The fuse circuit of claim 1, wherein the driving current controller allows a potential of the first node in the test mode to be greater than that in a normal mode.

5. The fuse circuit of claim 1, wherein the driving current controller comprises:
a first driving unit configured to receive the test signal, and to drive the first node in response to the test signal; and
a second driving unit configured to receive the test signal, and to drive the first node in response to the test signal,
wherein the first driving unit and the second driving unit each have a different driving strength from the other.

6. The fuse circuit of claim 5, wherein the first driving unit is enabled during the normal mode, the second driving unit is enabled during the test mode, and the second driving unit has a current driving strength greater than that of the first driving unit.

7. The fuse circuit of claim 1, wherein the driving current controller comprises:
a basic driving unit configured to receive the fuse state signal, and drive the first node; and
an additional driving unit configured to receive the fuse state signal, and to additionally drive the first node in response to the test signal.

8. The fuse circuit of claim 7, wherein the basic driving unit is enabled during the normal mode, and the basic driving unit and the additional driving unit are enabled during the test mode.

9. The fuse circuit of claim 1, wherein the fuse unit comprises:
a fuse configured to program desired information; and
a switching unit configured to couple the fuse into the current path in response to the fuse enable signal,
wherein the fuse and the switching unit are coupled between the first node and a power source voltage stage.

10. The fuse circuit of claim 1, wherein the fuse unit comprises:
a plurality of fuses configured to be used to program address information corresponding to a memory cell to be repaired; and
a plurality of switching units configured to correspond to each of the plurality of the fuses, and to couple a corresponding fuse among the plurality of the fuses into the current path in response to an address signal corresponding to the fuse enable signal.

11. A fuse circuit comprising:
a fuse unit configured to form a current path on a first node whether or not a fuse is cut;
a latching unit configured to latch the first node so as to output a fuse state signal; and
a supply current controller configured to control a driving current applied to the latching unit in response to a test signal.

12. The fuse circuit of claim 11, further comprising a pre-charging unit configured to pre-charge the first node in response to the pre-charge signal, and to set an initial value in the latching unit.

13. The fuse circuit of claim 11, wherein the supply current controller comprises:
a bias voltage generation unit configured to generate a bias voltage corresponding to the test signal; and
a current supply unit configured to supply the latching unit with the driving current corresponding to the bias voltage.

14. The fuse circuit of claim 11, wherein the supply current controller allows the driving current in a test mode to be greater than that in a normal mode and applies the resultant driving current to the latching unit.

15. The fuse circuit of claim 11, wherein the fuse unit comprises:
a fuse configured to be used to program desired information; and
a switching unit configured to couple the fuse into the current path in response to the fuse enable signal,
wherein the fuse and the switching unit are coupled between the first node and the power source voltage stage.

16. The fuse circuit of claim 11, wherein the fuse unit comprises:
a plurality of fuses configured to be used to program address information corresponding to the memory cell to be repaired; and
a plurality of switching units configured to correspond to each of the plurality of the fuses, and to couple a corresponding fuse among the plurality of fuses into the current path in response to an address signal corresponding to the fuse enable signal.

17. The fuse circuit of claim 11, wherein the latching unit comprises:
a forward driving unit configured to output the fuse state signal in response to the potential level of the first node; and
a backward driving unit configured to be supplied with the driving current controlled from the supply current controller, and to drive the first node after receiving a feedback of the fuse state signal.

18. A method for driving a fuse circuit, the method comprising:
generating a test signal when a test mode is entered;
forming a current path through a first node and a fuse;
driving the first node in response to a test signal; and
detecting a state of the fuse after buffering a potential of the first node.

19. The method for driving the fuse circuit of claim 18, wherein driving the first node comprises:
driving the first node in a normal mode by a normal driving current flowing through the current path; and
driving the first node in a test mode by a test driving current greater than the normal driving current.

20. The method for driving the fuse circuit of claim 18, wherein the fuse has address information, corresponding to a memory cell to be repaired, programmed therein.

* * * * *